(12) United States Patent
Kim

(10) Patent No.: US 7,193,913 B2
(45) Date of Patent: Mar. 20, 2007

(54) SENSE AMPLIFIER CIRCUIT AND READ/WRITE METHOD FOR SEMICONDUCTOR MEMORY DEVICE

(75) Inventor: Byung-chul Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/029,354

(22) Filed: Jan. 6, 2005

(65) Prior Publication Data
US 2005/0152196 A1 Jul. 14, 2005

(30) Foreign Application Priority Data
Jan. 10, 2004 (KR) .............. 10-2004-0001814

(51) Int. Cl.
*G11C 7/00* (2006.01)
(52) U.S. Cl. ............. 365/205; 365/189.04; 365/189.01
(58) Field of Classification Search ................. 365/205
See application file for complete search history.

(56) References Cited

U.S. PATENT DOCUMENTS

| 5,729,500 | A | * | 3/1998 | Shinozaki | .............. | 365/230.01 |
| 5,889,699 | A | * | 3/1999 | Takano | ................... | 365/185.18 |
| 6,185,256 | B1 | * | 2/2001 | Saito et al. | ................ | 375/257 |
| 6,301,169 | B1 | * | 10/2001 | Kikuda et al. | .............. | 365/201 |
| 2002/0131312 | A1 | * | 9/2002 | Issa et al. | ................... | 365/207 |
| 2003/0031066 | A1 | * | 2/2003 | Yanagisawa et al. | ........ | 365/200 |
| 2004/0136251 | A1 | * | 7/2004 | Mizuno et al. | ............. | 365/203 |

FOREIGN PATENT DOCUMENTS

| KR | 010002480 A | 1/2001 |
| KR | 1020020084531 A | 11/2002 |

* cited by examiner

*Primary Examiner*—Thong Q. Le
(74) *Attorney, Agent, or Firm*—Volentine & Whitt, PLLC

(57) ABSTRACT

A sense amplifier circuit comprising a local I/O line pair, a global I/O line pair, a write amplification unit for amplifying and transferring data output from the global I/O line pair to the local I/O line pair in response to a first control signal, and a read amplification unit for amplifying and transferring data output from the local I/O line pair to the global I/O line pair in response to a second control signal.

10 Claims, 6 Drawing Sheets

US 7,193,913 B2

SENSE AMPLIFIER CIRCUIT AND READ/WRITE METHOD FOR SEMICONDUCTOR MEMORY DEVICE

BACKGROUND OF THE INVENTION

1. Field of the Invention

The present invention relates generally to the sense amplifier circuit for a semiconductor memory device. More particularly, the present invention relates to a sense amplifier circuit and an associated read/write method adapted for use in a semiconductor memory device, the sense amplifier circuit being capable of amplifying and outputting data during a write mode and a read mode.

A claim of priority is made to Korean Patent Application No. 04-1814 filed on Jan. 10, 2004 in the Korean Patent Office. The disclosure of this Korean Patent Application is hereby incorporated by reference in its entirety.

2. Description of the Related Art

As semiconductor memory devices, for example the Rambus dynamic random access memory (RDRAM) or contemporary double data rate (DDR) DRAMs, become increasingly integrated and chip sizes increase, the length of global input and output (I/O) line pairs for transferring data to memory cells necessarily becomes longer. As a result, the line loads placed on these I/O line pairs during data transfer operations increase significantly.

In order to solve this problem, semiconductor memory devices typically include a sense amplifier circuit for amplifying data between the global I/O line pair and a local I/O line pair. The sense amplifier circuit amplifies data during a read operation to reduce a delay time, tDAC, thereby improving the read speed for the semiconductor memory device.

Delay time tDAC is the time it takes to deliver data from a memory core in the semiconductor memory device via the global I/O line pair and the global I/O line sense amplifier circuit to an external I/O line block after a read command has been generated.

FIG. 1 is a circuit diagram showing the structure of a conventional, local sense amplifier circuit. Within FIG. 1, local sense amplifier circuit 100 comprises first through fifth transistors TR1, TR2, TR3, TR4, and TR5 which function as amplification circuits between a local I/O line pair LIO and LIOB and a global I/O line pair GIO and GIOB.

In addition, local sense amplifier circuit 100 comprises sixth and seventh transistors TR6 and TR7 which function as switches for directly connecting the local I/O line pair LIO and LIOB with the global I/O line pair GIO and GIOB.

The sixth and seventh transistors TR6 and TR7 are turned on or off in response to a first control signal PWBBLK. The first transistor TR1 and the fourth and fifth transistors TR4 and TR5 are turned on or off in response to a second control signal PWBLK.

The first control signal PWBBLK is activated during a write operation of the semiconductor memory device and deactivated during a read operation of the semiconductor memory device.

On the contrary, the second signal PWBLK is activated during the read operation of the semiconductor memory device and deactivated during the write operation of the semiconductor memory device.

The term "activated" describes a signal state that assumes an active logic level, where the active logic level is a voltage which turns a transistor on. The term "deactivated" describes a signal state that assumes an inactive logic level, where the inactive logic level is a voltage which turns a transistor off.

During a read operation in the semiconductor memory device, the first transistor TR1 and the fourth and fifth transistors TR4 and TR5 are turned on when the second control signal PWBLK is activated. Since the first control signal PWBBLK is deactivated during a read operation, the sixth and seventh transistors TR6 and TR7 are turned off.

Suppose that during a read operation the local I/O line LIO receives an active logic level signal from the memory core (not shown in the drawing) and the inverted local I/O line LIOB receives an inactive logic level signal. In this case, the second transistor TR2 is turned on, the third transistor TR3 is turned off, and the first, second, and fourth transistors TR1, TR2, and TR4 form a current path allowing inverted global I/O line GIOB to receive an inactive logic level while the global I/O line GIO receives an active logic level.

Suppose instead that during a read operation the local I/O line LIO receives an inactive logic level signal from the memory core and the inverted local I/O line LIOB receives an active logic level signal. In this case, the first, third, and fifth transistors TR1, TR3, and TR5 form a current path allowing the global I/O line GIO to receive an inactive logic level signal while the inverted global I/O line GIOB receives an active logic level signal.

Therefore, during a read operation, signals present on the local I/O line LIO are amplified and output to the global I/O line GIO, and signals present on the inverted local I/O line LIOB are amplified and output to the inverted global I/O line GIOB.

During a write operation in the semiconductor memory device, sixth and seventh transistors TR6 and TR7 are turned on when the first control signal PWBBLK is activated. Since the second control signal PWBLK is deactivated, the first, fourth, and fifth transistors TR1, TR4 and TR5 are turned off.

Suppose that during a write operation the global I/O line GIO receives an active logic level signal from a source external to the semiconductor memory device and the inverted global I/O line GIOB receives an inactive logic level signal. In this case, the active logic level signal on the global I/O line GIO is delivered to the local I/O line LIO, and the low level data on the global I/O line GIOB is delivered to the inverted local I/O line LIOB.

Suppose instead that during a write operation the global I/O line GIO receives an inactive logic level signal from a source external to the semiconductor memory device and the inverted global I/O line GIOB receives an active logic level signal. In this case, the inactive logic level signal on the global I/O line GIO is delivered to the local I/O line LIO, and the active logic level signal on the global I/O line GIOB is delivered to the inverted local I/O line LIOB.

Therefore, during a write operation, signals present on the global I/O line GIO are amplified and output to the local I/O line LIO, and signals present on the inverted global I/O line GIOB are amplified and output to the inverted local I/O line LIOB.

The signals applied to the local I/O line pair LIO and LIOB are input to the memory core through a bitline (not shown in the drawing).

FIG. 2 is a waveform timing diagram showing a write operation of the local sense amplifier circuit in FIG. 1 and related operation of a bitline. In FIG. 2, the global I/O line GIO and the local I/O line LIO are shown, but the inverted global I/O line GIOB and the inverted local I/O line LIOB are omitted. In addition, delay times between signals are not considered in FIG. 2.

A wordline W/L is activated, and then a write data input to a write driver circuit (not shown in the drawing) is loaded on the global I/O line pair GIO and GIOB after a predetermined time. The write data is transferred when the global I/O line GIO transitions to an inactive logic level.

When the first control signal PWBBLK is activated, the sixth and seventh transistors TR6 and TR7 are turned on and the write data is transferred to the local I/O line pair LIO and LIOB.

The write data loaded on the local I/O line pair LIO and LIOB is transferred to the bitline pair BL and BLB while a column selection line CSL is activated.

However, due to the high degree of integration and increased chip sizes in contemporary semiconductor memory devices, the lengths of the global I/O line pair are so long that the resulting line loads increase to the point where the transfer of write data is unacceptably delayed.

In addition, as the internal operating frequency of semiconductor memory device increases, the pulse widths of internal operating signals decrease. In particular, as the pulse width of the column selection line CSL decreases, the time during which the column selection line CSL is activated during a write operation decreases as well. This creates a problem where write data on the local I/O line pair LIO and LIOB can not be accurately transferred to the bitline pair BL and BLB. This can be identified in the waveforms of the bitline pair BL and BLB shown in FIG. 2.

SUMMARY OF THE INVENTION

The present invention provides a sense amplifier circuit capable of amplifying and transferring data to a memory core semiconductor memory device when a write operation is executed. The present invention also provides a write/read method for a sense amplifier circuit capable of amplifying and transferring data to a memory core when a write operation is executed in a semiconductor memory device.

According to one aspect of the present invention, a sense amplifier circuit is provided within a semiconductor memory device. The sense amplifier circuit comprises a local input and output (I/O) line pair, a global I/O line pair, a write amplification unit, and a read amplification unit.

The local I/O line pair preferably comprises a local I/O line and an inverted local I/O line. The global I/O line pair preferably comprises a global I/O line and an inverted global I/O line.

The write amplification unit amplifies data output from the global I/O line pair in response to a first control signal and transfers the data to the local I/O line pair. The read amplification unit may amplifies data output from the local I/O line pair in response to a second control signal and transfers the data to the global I/O line pair.

The read amplification unit is turned on and the write amplification unit is turned off when a read operation is executed in the semiconductor memory device, whereas the read amplification unit is turned off and the write amplification unit is turned on when a write operation is executed in the semiconductor memory device.

In a related aspect, the sense amplifier circuit preferably comprises first through fifth transistors. The first transistor has a first terminal connected to ground, a second terminal, and a gate receiving the second control signal. The second transistor has a gate connected to the local I/O line and a first terminal connected to the second terminal of the first transistor. The third transistor has a gate connected to the inverted local I/O line and a first terminal connected to the second terminal of the first transistor. The fourth transistor has a gate receiving the second control signal, a first terminal connected to a second terminal of the second transistor, and a second terminal connected to the inverted global I/O line. The fifth transistor has a gate receiving the second control signal, a first terminal connected the second terminal of the third transistor, and a second terminal connected to the global I/O line.

The first through fifth transistors TR1, TR2, TR3, TR4, and TR5 are preferably NMOS (N-channel metal oxide semiconductor) transistors.

The write amplification unit comprises sixth through eighth transistors. The sixth transistor has a first terminal connected to ground and a gate receiving the first control signal. The seventh transistor has a gate connected to the inverted global I/O line, a first terminal connected to a second terminal of the sixth transistor, and a second terminal connected to the local I/O line. The eighth transistor has a gate connected to the global I/O line, a first terminal connected to the second terminal of the sixth transistor, and a second terminal connected to the inverted local I/O line.

The sixth through eighth transistors TR6, TR7, and TR8 are preferably NMOS transistors.

The first control signal PWBBLK is generated by logically multiplying a bank selection signal for selecting a bank within a memory array on which a read or write operation is to be performed and a row block selection signal for selecting a row block of a memory array on which the read or write operation is to be performed.

The logic level of the second control signal is typically opposite that of the first control signal.

According to another aspect of the present invention, there is provided a read/write method applied to a sense amplifier circuit comprising a write amplification unit and a read amplification unit, the method comprising; determining if a read operation or a write operation is executed; turning on the write amplification unit in response to a first control signal when the write operation is executed; applying data received through a global I/O line pair to the write amplification unit; and amplifying and transferring the data to a local I/O line pair.

In a related aspect, the method further comprises; turning on the read amplification unit in response to a second control signal when the read operation is executed; applying data received through a local I/O line pair to the read amplification unit; and amplifying and transferring the data to the global I/O line pair.

The first control signal may be activated when the write operation is executed and deactivated when the read operation is executed, and the second control signal may be deactivated when the write operation is executed and activated when the read operation is executed.

The logic level of the second control signal is typically opposite to that of the first control signal.

According to still another aspect of the present invention, there is provided a read/write method for a semiconductor memory device comprising a local I/O line pair and a global I/O line pair, the method comprising; determining if a read operation or a write operation is executed; receiving data through the global I/O line pair when the write operation is executed; and amplifying and transferring the received data to the local I/O line pair.

In a related aspect, the read/write method further comprises; receiving data through the local I/O line pair when the read operation is executed; and amplifying and transferring the received data to the global I/O line pair.

BRIEF DESCRIPTION OF THE DRAWINGS

The above and other features and advantages of the present invention will become more readily apparent upon consideration of the detailed description of several exemplary embodiment(s) that follows, with reference to the accompanying drawings in which.

DETAILED DESCRIPTION OF THE INVENTION

Figure 1:
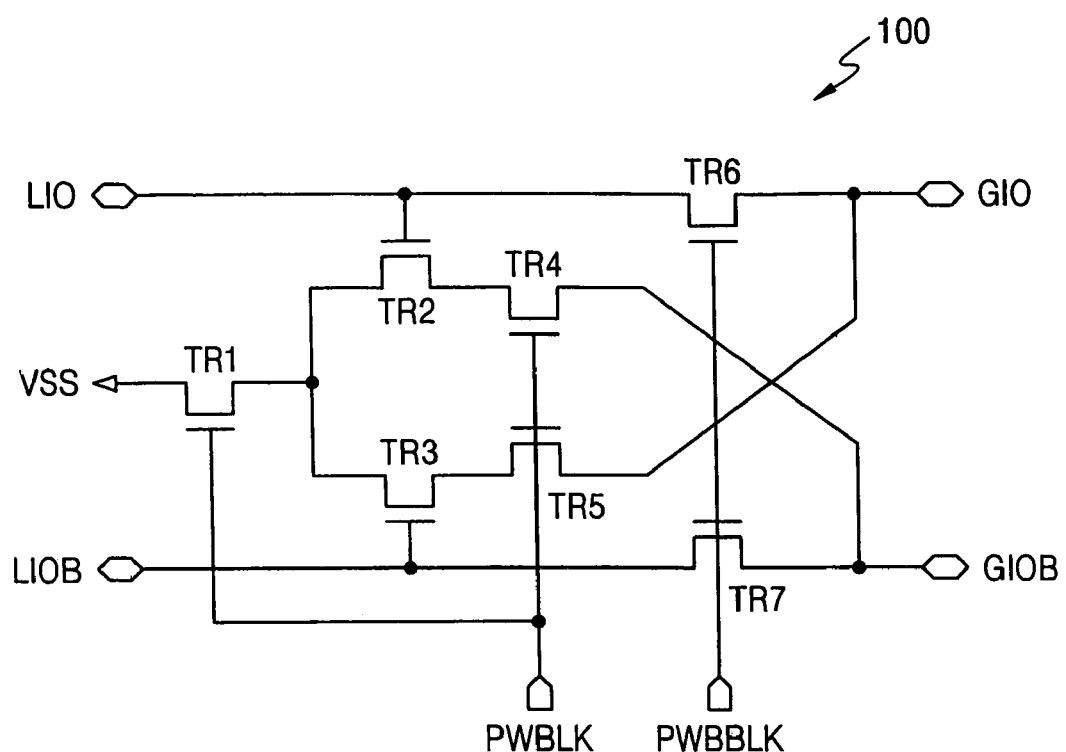
FIG. 1 is a circuit diagram showing the structure of a sense amplifier circuit in a conventional semiconductor memory device.

The present invention will now be described more fully with reference to the accompanying drawings, in which several exemplary embodiments of the present invention are shown. Throughout the drawings, like reference numerals are used to refer to like elements.

Figure 3:
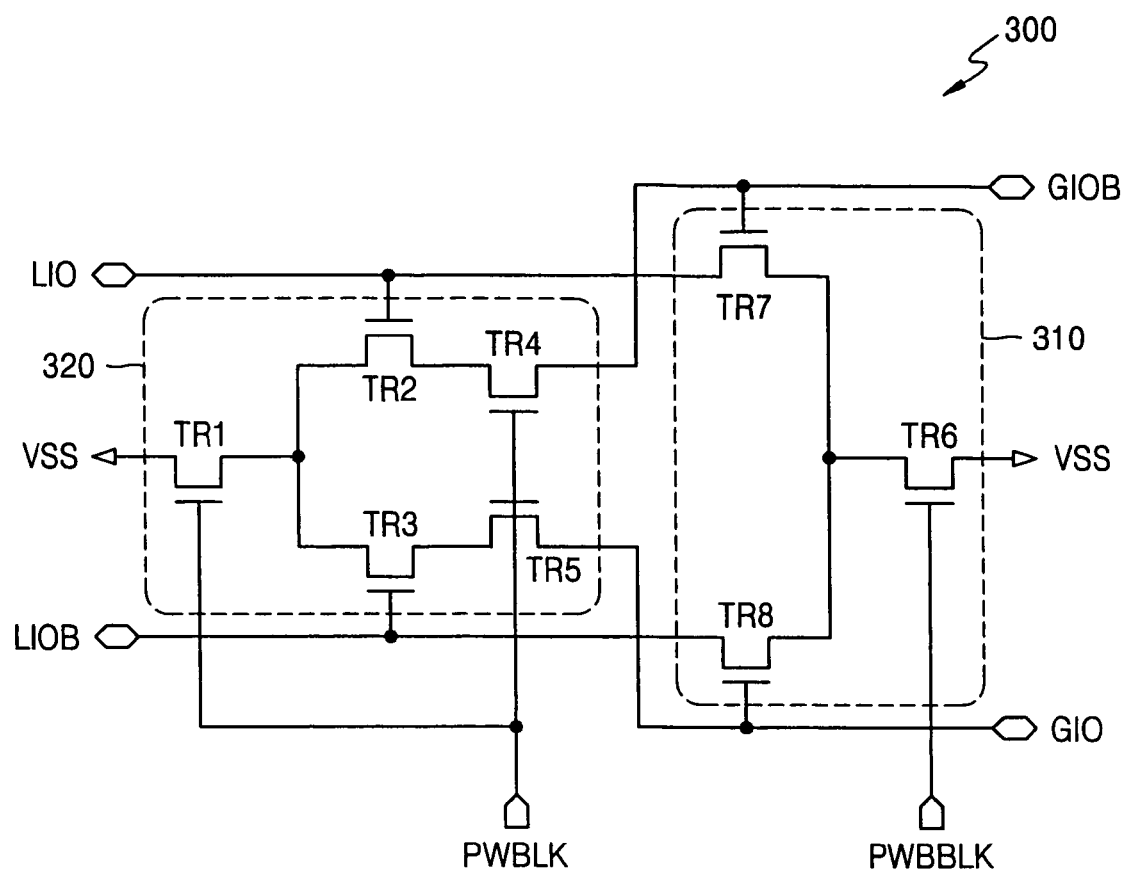
FIG. 3 is a circuit diagram showing the structure of a local sense amplifier circuit according to one embodiment of the present invention.

Referring to FIG. 3, sense amplifier circuit 300 of a semiconductor memory device according to the present invention comprises a local input and output (I/O) line pair LIO and LIOB, a global I/O line pair GIO and GIOB, a write amplification unit 310, and a read amplification unit 320.

The local I/O line pair LIO and LIOB comprises a local I/O line LIO and an inverted local I/O line LIOB. The global I/O line pair GIO and GIOB comprises a global I/O line GIO and an inverted global I/O line GIOB.

The write amplification unit 310 amplifies data output from the global I/O line pair GIO and GIOB and transfers them to the local I/O line pair LIO and LIOB in response to a first control signal PWBBLK.

The read amplification unit 320 amplifies data output from the local I/O line pair LIO and LIOB and transfers them to the global I/O line pair GIO and GIOB in response to a second control signal PWBLK.

Figure 5:
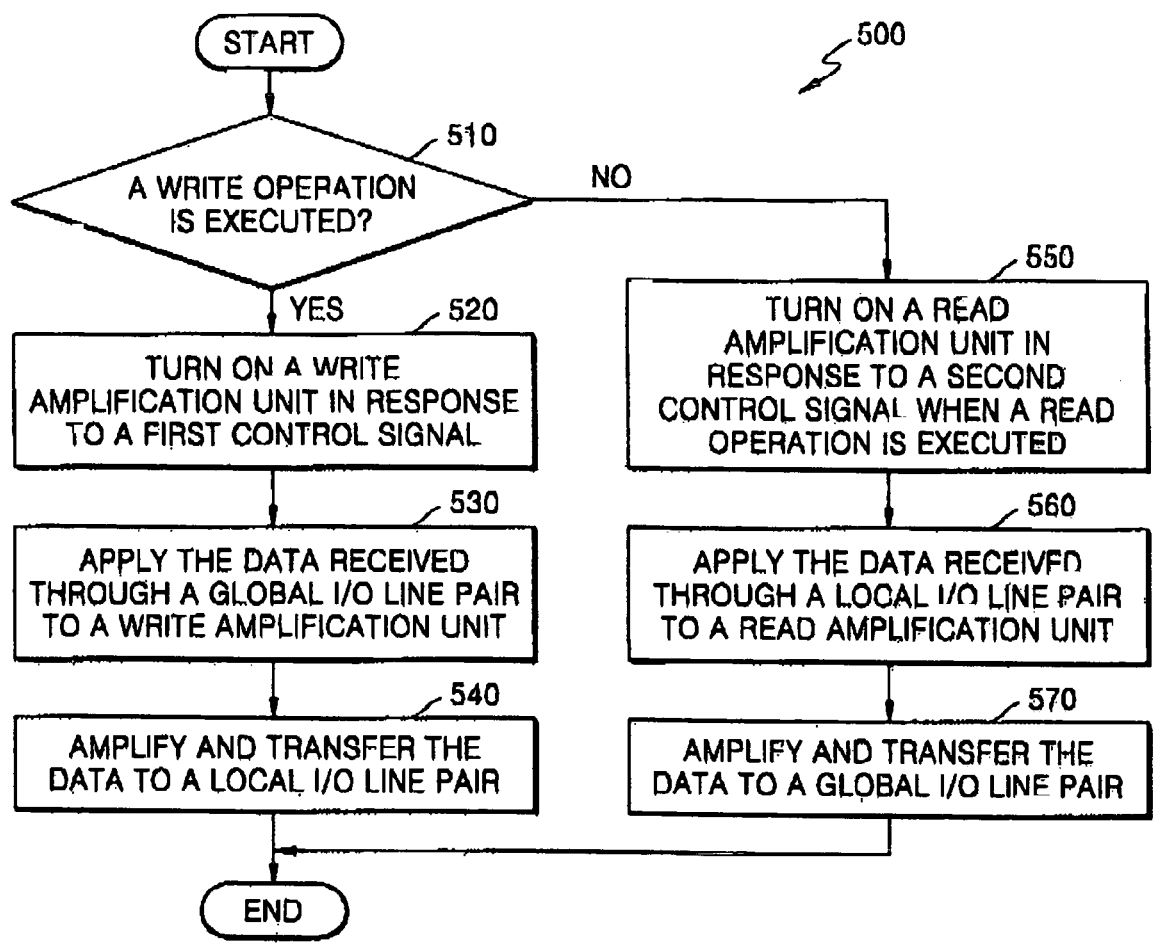
FIG. 5 is a flow chart describing a read/write method for a local sense amplifier circuit according to another embodiment of the present invention.

FIG. 5 is a flowchart illustrating a read/write method related to the sense amplifier circuit shown in FIG. 3. In FIG. 5, a read/write method 500 for a sense amplifier circuit comprising a write amplification unit and a read amplification unit is described. According to method 500, it first is determined whether a read operation or a write operation is executed (510). When a write operation is executed, a write amplification unit is turned on in response to a first control signal (520), data apparent at a global I/O line pair is received by the write amplification unit (530), and the data is amplified and transferred to a local I/O line pair (540). When a read operation is executed, a read amplification unit is turned on in response to a second control signal (550), data apparent at the local I/O line pair is received by the read amplification unit (560), and the data is amplified and transferred to the global I/O line pair (570).

A sense amplifier circuit and a read/write method for the sense amplifier circuit according to one embodiment of the present invention will now be described with reference to FIGS. 3, 4 and 5.

Sense amplifier circuit 300 in FIG. 3 comprises a local I/O line pair LIO and LIOB, a global I/O line pair GIO and GIOB, a write amplification unit 310, and a read amplification unit 320.

Read amplification unit 320 comprises first through fifth transistors TR1, TR2, TR3, TR4, and TR5.

First transistor TR1 has a first terminal connected to ground (VSS) and a gate receiving the second control signal PWBLK. Second transistor TR2 has a gate connected to the local I/O line LIO and a first terminal connected to a second terminal of the first transistor TR1.

Third transistor TR3 has a gate connected to the inverted local I/O line LIOB and a first terminal connected to the second terminal of the first transistor TR1. The fourth transistor TR4 has a gate receiving the second control signal PWBLK, a first terminal connected to the second terminal of the second transistor TR2, and a second terminal connected to the inverted global I/O line GIOB.

Fifth transistor TR5 has a gate receiving the second control signal PWBLK, a first terminal connected to the second terminal of the third transistor TR3, and a second terminal connected to the global I/O line GIO. The first through fifth transistors TR1, TR2, TR3, TR4 and TR5 are preferably NMOS (N-channel Metal Oxide Semiconductor) transistors.

Read amplification unit 320, comprising the first through fifth transistors TR1, TR2, TR3, TR4 and TR5, functions as an amplification circuit which is turned on or off in response to the logic level of the second control signal PWBLK.

Write amplification unit 310 comprises sixth through eighth transistors TR6, TR7 and TR8. The sixth transistor TR6 has a first terminal connected to ground and a gate receiving the first control signal PWBBLK.

Seventh transistor TR7 has a gate connected to the inverted global I/O line GIOB, a first terminal connected to the second terminal of the sixth transistor TR6, and a second terminal connected to the local I/O line LIO.

Eighth transistor TR8 has a gate connected to the global I/O line GIO, a first terminal connected to the second terminal of the sixth transistor TR6, and a second terminal connected to the inverted local I/O line LIOB.

The sixth through eighth transistors TR6, TR7 and TR8 are preferably NMOS transistors.

Write amplification unit 310 comprising the sixth through eighth transistors TR6, TR7 and TR8 functions as an amplification circuit which is turned on or off in response to the logic level of the first control signal PWBBLK.

Within the context of this sense amplifier configuration, it is first determined whether a write operation or a read operation is executed (510). If the write operation is executed then write amplification unit 310 is turned on in response to the first control signal PWBBLK (520) and read amplification unit 320 is turned off. Otherwise, if a read operation is executed then the read amplification unit 320 is turned on in response to the second control signal (550) and write amplification unit 310 is turned off.

The first control signal PWBBLK is generated by logically multiplying a bank selection signal (not shown in the drawing) for selecting a bank within a memory array on which a write operation or a read operation is to be executed and a row block selection signal (not shown in the drawing) for selecting a row block of a memory array on which a read operation or a write operation is to be executed.

In other words, when the write operation is executed, the first control signal PWBBLK is activated to turn on write amplification unit 310, and the second control signal PWBLK is deactivated to turn off read amplification unit 320.

The logic level of the second control signal PWBLK is opposite to the logic level of the first control signal PWBBLK.

The data received through the global I/O line pair GIO and GIOB are applied to write amplification unit 310 (530). Then, the data is amplified and transferred to the local I/O line pair LIO and LIOB (540).

When the first control signal PWBBLK is activated, the sixth transistor TR6 turns on and write amplification unit 310 starts to operate.

Suppose that during a write operation the inverted global I/O line GIOB receives an active logic level signal and the global I/O line GIO receives an inactive logic level signal. In this case the seventh transistor TR7 is turned on by the active logic level signal at the inverted global I/O line GIOB, and the local I/O line LIO receives an inactive logic level signal. The eighth transistor TR8 is turned off by an inactive logic level signal applied to the global I/O line G10, and an active logic level signal is received by the inverted local I/O line LIOB.

Suppose instead that during a write operation the inverted global I/O line GIOB receives an inactive logic level signal and the global I/O line GIO receives an active logic level signal. In this case, the seventh transistor TR7 is turned off by the inactive logic level signal at the inverted global I/O line GIOB, and the local I/O line LIO receives an active logic level signal. The eighth transistor TR8 is turned on by an active logic level signal applied to the global I/O line GIO, and an inactive logic level signal is received by the inverted local I/O line LIOB.

In both cases, the data applied to the local I/O line pair LIO and LIOB have been amplified by the write amplification unit 310. Therefore, regardless of any reduction in the duration that a column selection line CSL is activated due to increased internal operation frequency of the core semiconductor memory device, signals transferred to the local I/O line pair LIO and LIOB are perfectly delivered to the bitline pair BL and BLB.

Figure 4:
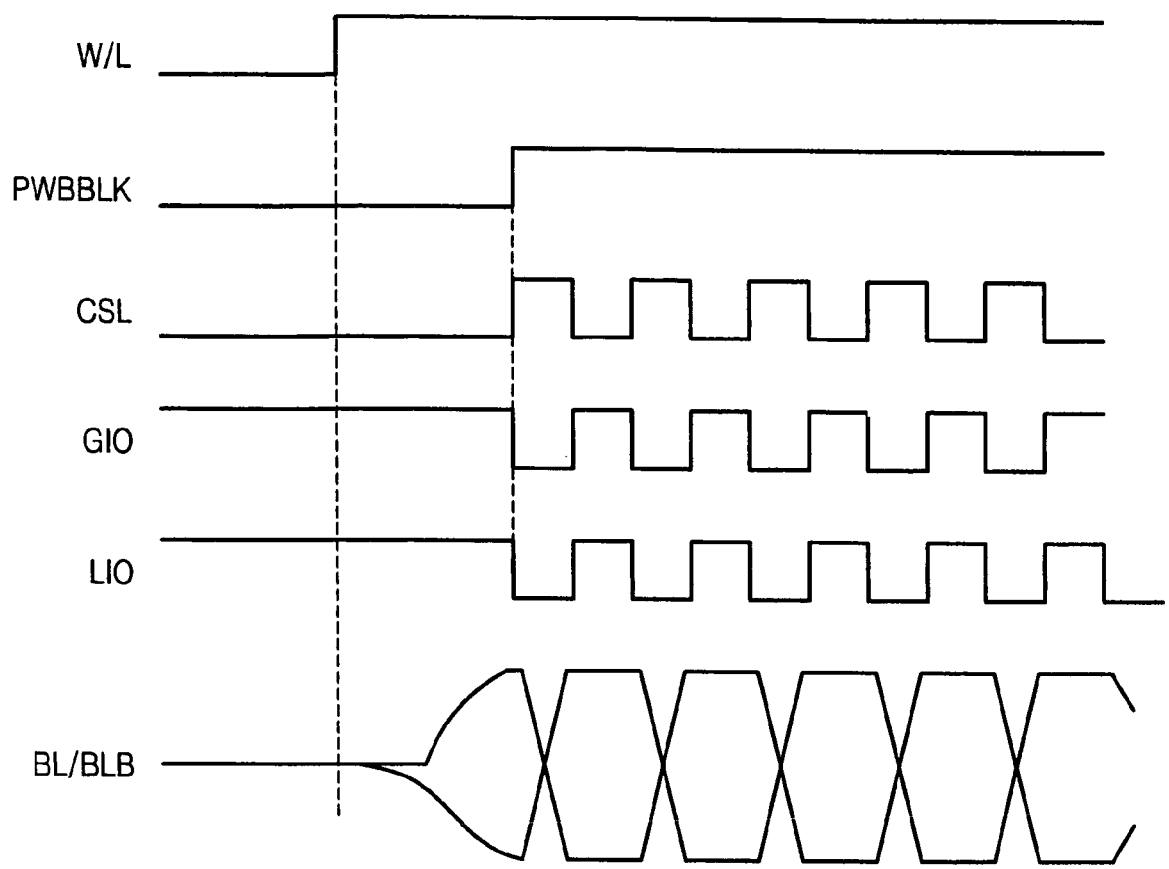
FIG. 4 is a waveform timing diagram illustrating a write operation for the local sense amplifier circuit shown in FIG. 3 and the operation of a related bitline.

Referring to the waveform timing diagram shown in FIG. 4, a wordline W/L is activated. Then, the column section line CSL is activated after a predetermined period. When the global I/O line GIO and the local I/O line LIO are at a low level, signals applied to the global I/O line GIO and the local I/O line LIO are transferred.

Figure 2:
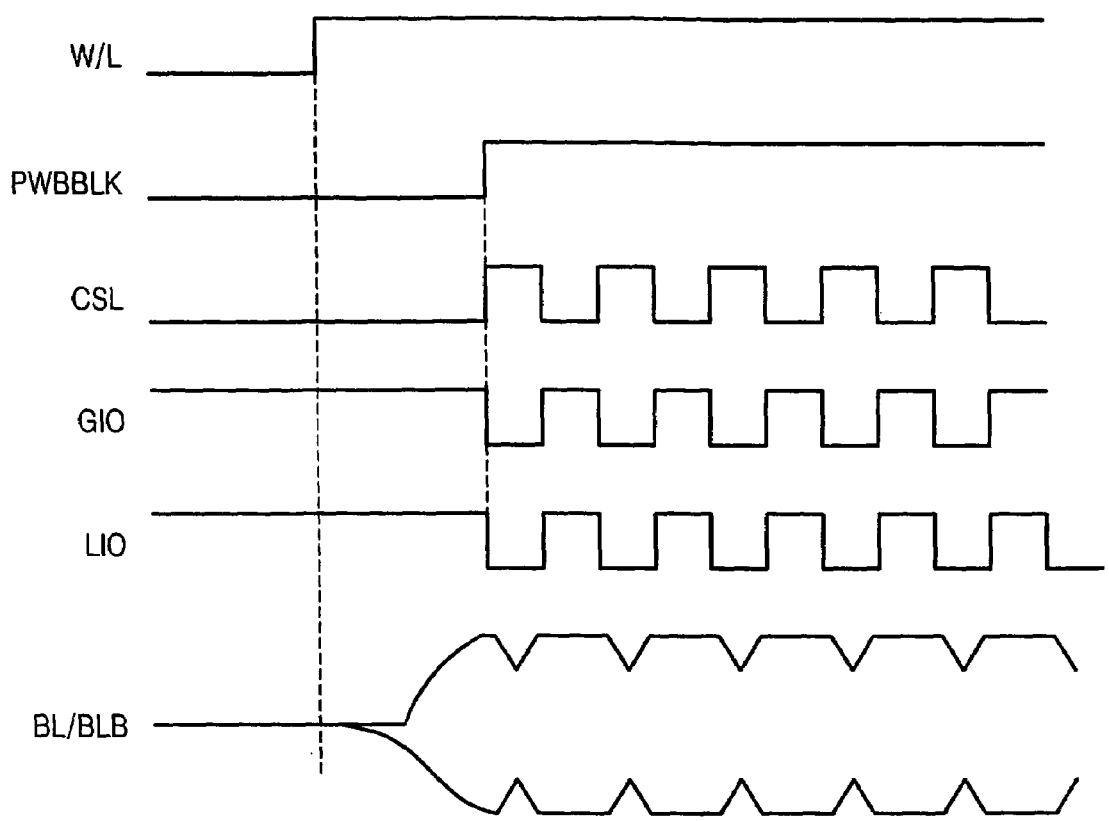
FIG. 2 is a waveform timing diagram illustrating a write operation for the local sense amplifier circuit shown in FIG. 1 and the operation of a related bitline.

Even though the duration for which the CSL is activated is the same as the case of the conventional waveform timing chart in FIG. 2, the signals are accurately delivered to the bitline pair BL and BLB, as can be seen by comparing FIG. 4 to FIG. 2.

When the read operation is executed, read amplification unit 320 is turned on in response to the second control signal PWBLK (550).

When the read operation is executed, the second control signal PWBLK is activated to turn on the first, fourth and fifth transistors TR1, TR4 and TR5.

Signals received through the local I/O line pair LIO and LIOB are applied to read amplification unit 320 (560). The signals are amplified and output to the global I/O line pair GIO and GIOB (570).

Suppose that during a read operation the local I/O line LIO receives an active logic level signal and the inverted local I/O line LIOB receives an inactive logic level signal. The second transistor TR2 is turned on, an inactive logic level signal is transferred to the inverted global I/O line GIOB, the third transistor TR3 is turned off, and an active logic level signal is transferred to the global I/O line GIO.

Suppose instead that during a read operation the local I/O line LIO receives an inactive logic level signal and the inverted local I/O line LIOB receives an active logic level signal. The second transistor TR2 is turned off, an active logic level signal is transferred to the inverted global I/O line GIOB, the third transistor TR3 is turned on, and an inactive logic level signal is transferred to the global I/O line GIO.

In both cases, the signals applied to the global I/O line pair GIO and GIOB have been amplified by the read amplification unit 320.

As described above, sense amplifier circuit 300 according to one embodiment of the present invention can amplify and transfer data to the memory core (not shown in the drawing) when a write operation as well as a read operation is executed.

Therefore, it is possible to solve the problem of data transfer errors due to the increasing operation speed of the memory core.

Figure 6:
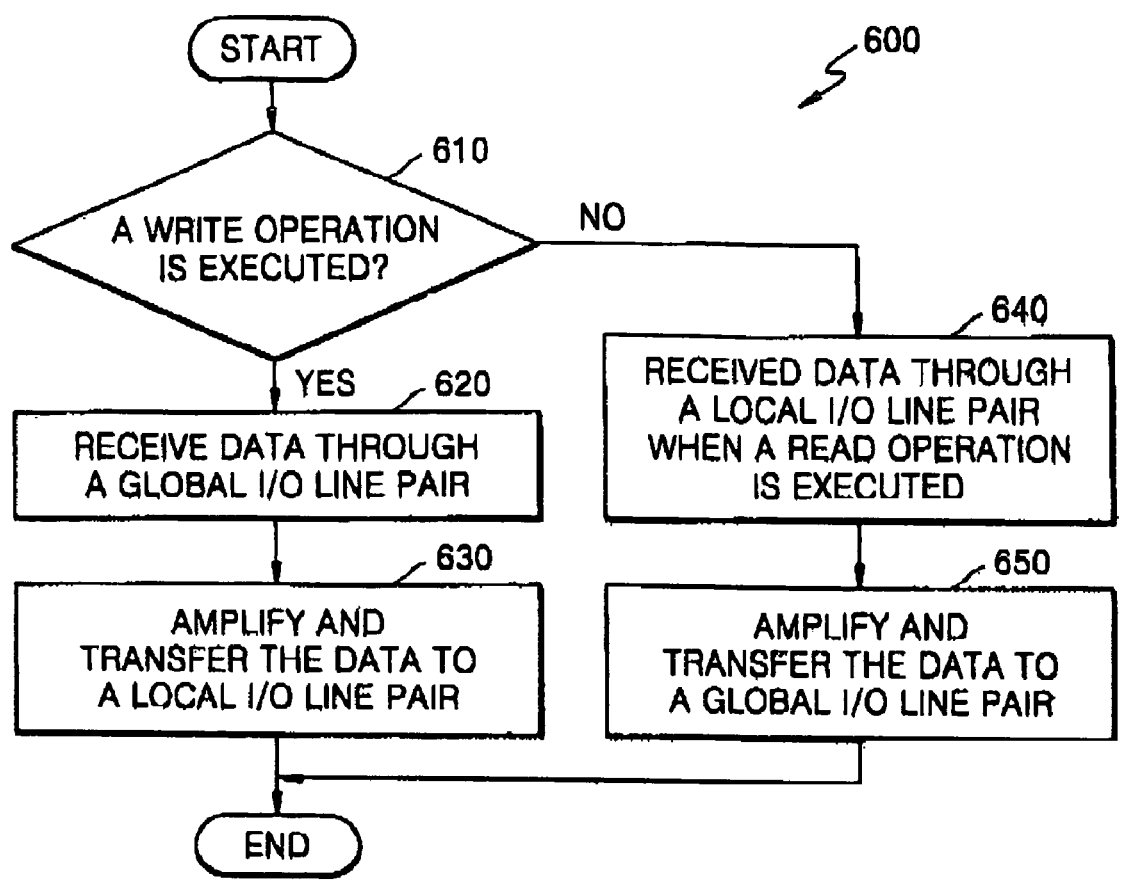
FIG. 6 is a flow chart describing a read/write method according to still another embodiment of the present invention.

FIG. 6 is a flowchart illustrating a read/write method related to the sense amplifier circuit shown in FIG. 3. In FIG. 6, a read/write method 600 for a sense amplifier circuit comprising a write amplification unit and a read amplification unit is described. According to method (600), it first is determined whether a read operation or a write operation is executed (610). When a write operation is executed, data is received through a global I/O line pair GIO and GIOB (620), and the data is amplified and transferred to a local I/O line pair (630). When a read operation is executed, data is received through the local I/O line pair (640), and the data is amplified and transferred to the global I/O line pair (650).

The amplification of the received data can be accomplished using an amplification circuit capable of amplifying data. For example, write amplification unit 310 in FIG. 3 can be used as an amplification circuit.

Beside write amplification unit 310 in FIG. 3, a variety of other circuits capable of amplifying input data may be used as an amplification circuit. Operations and structures of the amplification circuits are conventional, and thus their detailed description will not be given.

If the read operation is executed, data is received through the local I/O line pair LIO and LIOB (640). Then, the received data is amplified and transferred to the global I/O line pair GIO and GIOB (650).

The amplification of the received data can be accomplished by using an amplification circuit capable of amplifying data. For example, read amplification unit 320 in FIG. 3 can be used as an amplification circuit.

Beside read amplification unit 310 in FIG. 3, a variety of other circuits capable of amplifying input data can be used as an amplification circuit. Operations and structures of the amplification circuits are conventional, and thus their detailed description will not be described herein.

According to a sense amplifier circuit and a read/write method according to the present invention, it is possible to prevent the generation of write errors otherwise caused by an increasing operation speed of a memory core, because data is amplified prior to being written to a memory core. The preferred embodiments of the present invention are disclosed in the drawings and the specification, as described above. These teaching embodiments are, however, exemplary. It will be understood by those of ordinary skill in the art that various changes in form and details may be made therein without departing from the scope of the present invention as defined by the following claims.

What is claimed is:

1. A sense amplifier circuit for a semiconductor memory device, the sense amplifier circuit comprising:
   a local I/O line pair comprising a local I/O line and an inverted local I/O line;
   a global I/O line pair comprising a global I/O line and an inverted global I/O line;
   a write amplification unit amplifying data output from the a global I/O line pair in response to a first control signal and transferring the data to the local I/O line pair; and
   a read amplification unit amplifying data output from the local I/O line pair in response to a second control signal and transferring the data to the global I/O line pair;
   wherein the read amplification unit comprises:
   a first transistor having a first terminal connected to ground, a second terminal, and a gate receiving the second control signal;
   a second transistor having a gate connected to the local I/O line and a first terminal connected to the second terminal of the first transistor, and a second terminal;
   a third transistor having a gate connected to the inverted local I/O line, a first terminal connected to the second terminal of the first transistor, and a second terminal;
   a fourth transistor having a gate receiving the second control signal, a first terminal connected to the second terminal of the second transistor, and a second terminal connected to the inverted global I/O line; and
   a fifth transistor having a gate receiving the second control signal, a first terminal connected the second terminal of the third transistor, and a second terminal connected to the global I/O line.

2. The sense amplifier circuit according to claim 1, wherein the first through fifth transistors are NMOS transistors.

3. The sense amplifier circuit according to claim 1, wherein the write amplification unit comprises:
   a sixth transistor having a first terminal connected to ground, a gate receiving the first control signal, and a second terminal;
   a seventh transistor having a gate connected to the inverted global I/O line, a first terminal connected to the second terminal of the sixth transistor, and a second terminal connected to the local I/O line; and
   an eighth transistor having a gate connected to the global I/O line, a first terminal connected to the second terminal of the sixth transistor, and a second terminal connected to the inverted local I/O line.

4. The sense amplifier circuit according to claim 3, wherein the sixth through eighth transistors are NMOS transistors.

5. The sense amplifier circuit according to claim 1, wherein
   the first control signal is generated by logically multiplying a bank selection signal for selecting a bank of a memory array on which a read or write operation is to be performed and a row block selection signal for selecting a row block of a memory array on which the read or write operation is to be performed.

6. The sense amplifier circuit according to claim 1, wherein
   a logic level of the second control signal is opposite to a logic level of the first control signal.

7. A sense amplifier circuit adapted for use in a semiconductor memory device, the sense amplifier circuit comprising:
   a local I/O line pair comprising a local I/O line and an inverted local I/O line;
   a global I/O line pair comprising a global I/O line and an inverted global I/O line;
   a write amplification unit disposed between and switchably separating the local I/O line pair and the global I/O line pair and adapted to amplify data output from the global I/O line pair in response to a first control signal and transfer the data to the local I/O line pair; and
   a read amplification unit disposed between and switchably separating the local I/O line pair and the global I/O line pair and adapted amplify data output from the local I/O line pair in response to a second control signal and transfer the data to the global I/O line pair;
   wherein the read amplification unit comprises:
   a first transistor having a first terminal connected to ground, a second terminal, and a gate receiving the second control signal;
   a second transistor having a gate connected to the local I/O line and a first terminal connected to the second terminal of the first transistor, and a second terminal;
   a third transistor having a gate connected to the inverted local I/O line, a first terminal connected to the second terminal of the first transistor, and a second terminal;
   a fourth transistor having a gate receiving the second control signal, a first terminal connected to the second terminal of the second transistor, and a second terminal connected to the inverted global I/O line; and
   a fifth transistor having a gate receiving the second control signal, a first terminal connected the second terminal of the third transistor, and a second terminal connected to the a global I/O line.

8. The sense amplifier circuit of claim 7, wherein
   the read amplification unit is turned on and the write amplification unit is turned off when a read operation is executed in the semiconductor memory device; and,
   wherein the read amplification unit is turned off and the write amplification unit is turned on when a write operation is executed in the semiconductor memory device.

9. The sense amplifier circuit according to claim 7, wherein
   the first control signal is generated by logically multiplying a bank selection signal for selecting a bank of a memory array on which a read or write operation is to be performed and a row block selection signal for selecting a row block of a memory array on which the read or write operation is to be performed.

10. The sense amplifier circuit according to claim 7, wherein
    a logic level of the second control signal is opposite to a logic level of the first control signal.

* * * * *